US007813254B2

(12) United States Patent
Siegert et al.

(10) Patent No.: US 7,813,254 B2
(45) Date of Patent: Oct. 12, 2010

(54) PIEZOELECTRIC READING OF FERROELECTRIC DATA STORAGE MEDIA

(75) Inventors: Markus Jan Peter Siegert, Pittsburgh, PA (US); Andreas Karl Roelofs, Pittsburgh, PA (US); Martin Gerard Forrester, Murraysville, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 916 days.

(21) Appl. No.: 11/704,124

(22) Filed: Feb. 8, 2007

(65) Prior Publication Data

US 2008/0192528 A1 Aug. 14, 2008

(51) Int. Cl.
*G11B 9/00* (2006.01)

(52) U.S. Cl. .......................................... 369/126

(58) Field of Classification Search .................... None
See application file for complete search history.

(56) References Cited

U.S. PATENT DOCUMENTS 5,886,922 A 3/1999 Saito et al. .................. 365/164
5,985,404 A * 11/1999 Yano et al. ............... 428/846.1
7,026,676 B2 4/2006 Ahner et al. ................ 257/295
2002/0033991 A1 3/2002 Hester ........................ 359/290
2004/0027935 A1* 2/2004 Cho et al. ...................... 369/43
2004/0042351 A1 3/2004 Onoe et al. .............. 369/13.01
2004/0047246 A1 3/2004 Onoe et al. .............. 369/13.11
2004/0105373 A1* 6/2004 Maeda et al. ............... 369/101
2005/0099895 A1 5/2005 Maeda et al. ........... 369/13.01
2005/0128616 A1 6/2005 Johns et al. .................... 360/15
2005/0213364 A1 9/2005 Kijima et al. ............... 365/145
2006/0018239 A1 1/2006 Nam et al. .................. 369/126
2006/0023606 A1* 2/2006 Lutwyche et al. ........... 369/100

OTHER PUBLICATIONS

P. Vettiger et al., "The 'Millipede'—Nanotechnology Entering Data Storage," IEEE Transactions on Nanotechnology, vol. 1, No. 1, Mar. 2002.

A. Sheikholeslami, "A Survey of Circuit Innovations in Ferroelectric Ransom-Access Memories," Proceeding of the IEEE, vol. 88, No. 5, May 2000.

* cited by examiner

*Primary Examiner*—Paul Huber
(74) *Attorney, Agent, or Firm*—David C. Bohn; Westman, Champlin & Kelly, P.A.

(57) ABSTRACT

An apparatus comprises mechanically scanned ferroelectric data storage media. A scanning electrode contacts the scannable surface with a contact force. The ferroelectric data storage media generates a piezoelectric potential that is picked up by the electrode. The piezoelectric potential has a polarity that varies as a function of data polarity on the data storage media.

20 Claims, 8 Drawing Sheets

SECTION 1C-1C

POTENTIAL DETECTOR OUTPUT
238
234
POTENTIAL DETECTOR
236
232

230
220
224
222
212
214
216
218
226
PROBE MOTION
X
0
200
207
206
208
204
202
210

READ MODE COMMAND
PROBE FORCE
POLARIZATION DIRECTION UNDER PROBE
CARRIER AMPLITUDE AT PROBE
VOLTAGE PHASE AT PROBE 400
402
404
406
408
410
412
414
416
418
420
422
430
432
434
436
438
440
0

PIEZOELECTRIC READING OF FERROELECTRIC DATA STORAGE MEDIA

FIELD

The present invention relates generally to ferroelectric data storage media, and more particularly but not by limitation to non-destructively reading of ferroelectric data storage media with an electrode array.

BACKGROUND

Known ferroelectric readback methods are either excessively complex and costly or inherently erase data that is being read. In ferroelectric storage devices, information is stored in ferroelectric domains. For writing data into the ferroelectric material, small ferroelectric domains are formed by locally applying an electrical field with a very small tip. For reading the data back, various methods are available, including piezo-force-microscopy (PFM), scanning-nonlinear-dielectric-microscopy (SNDM), and erase read-back (ERB). All three methods have certain disadvantages for the electrode storage application. PFM and SNDM both require complicated measurement instruments. PFM requires an atomic force microscopy (AFM) like setup to measure the very small height change, whereas SNDM requires a microwave resonator, an oscillator and a FM demodulator to measure the local dielectric response. ERB senses the polarization currents by switching all domains into one polarization state, which erases the stored information. Therefore after reading the data, the data must be rewritten.

A method and apparatus are needed for reading data from ferroelectric storage media without erasing the data and without complex, expensive, high power readback mechanisms. Aspects of the present invention provide solutions to these and other problems, and offer other advantages over the prior art.

SUMMARY

Disclosed is an apparatus that comprises ferroelectric data storage media with a scannable surface. The apparatus comprises an electrode contacting the scannable surface with a contact force. The ferroelectric data storage media generates a piezoelectric potential that is picked up by the electrode. The piezoelectric potential has a polarity that varies as a function of data polarity on the data storage media.

In one aspect, the piezoelectric potential comprises a baseband potential. In another aspect, the contact force is modulated, and the piezoelectric potential comprises a modulated piezoelectric potential.

Other features and benefits that characterize aspects of the present invention will be apparent upon reading the following detailed description and review of the associated drawings.

DETAILED DESCRIPTION

In the aspects described below, a ferroelectric data storage layer is scanned with an electrode. A force (pressure) is applied to the electrode. There is a piezoelectric response in the ferroelectric data storage layer to the pressure of an electrode tip placed in direct contact on the surface of the ferroelectric material. The piezoelectric response is used to sense a polarization state of the data storage layer under the electrode tip. When this tip moves over the surface while maintaining the pressure, and passes along differently polarized regions of the data storage layer, the piezoelectric effect produces a piezoelectric signal. The polarity or phase of the piezoelectric signal corresponds to the polarization state of the region underneath the tip. The data stored on the ferroelectric data storage layer can be read as a piezoelectric voltage without erasing the data and without the use of apparatus that is excessively complex, delicate and costly to be used in a data storage device.

Figure 2A:
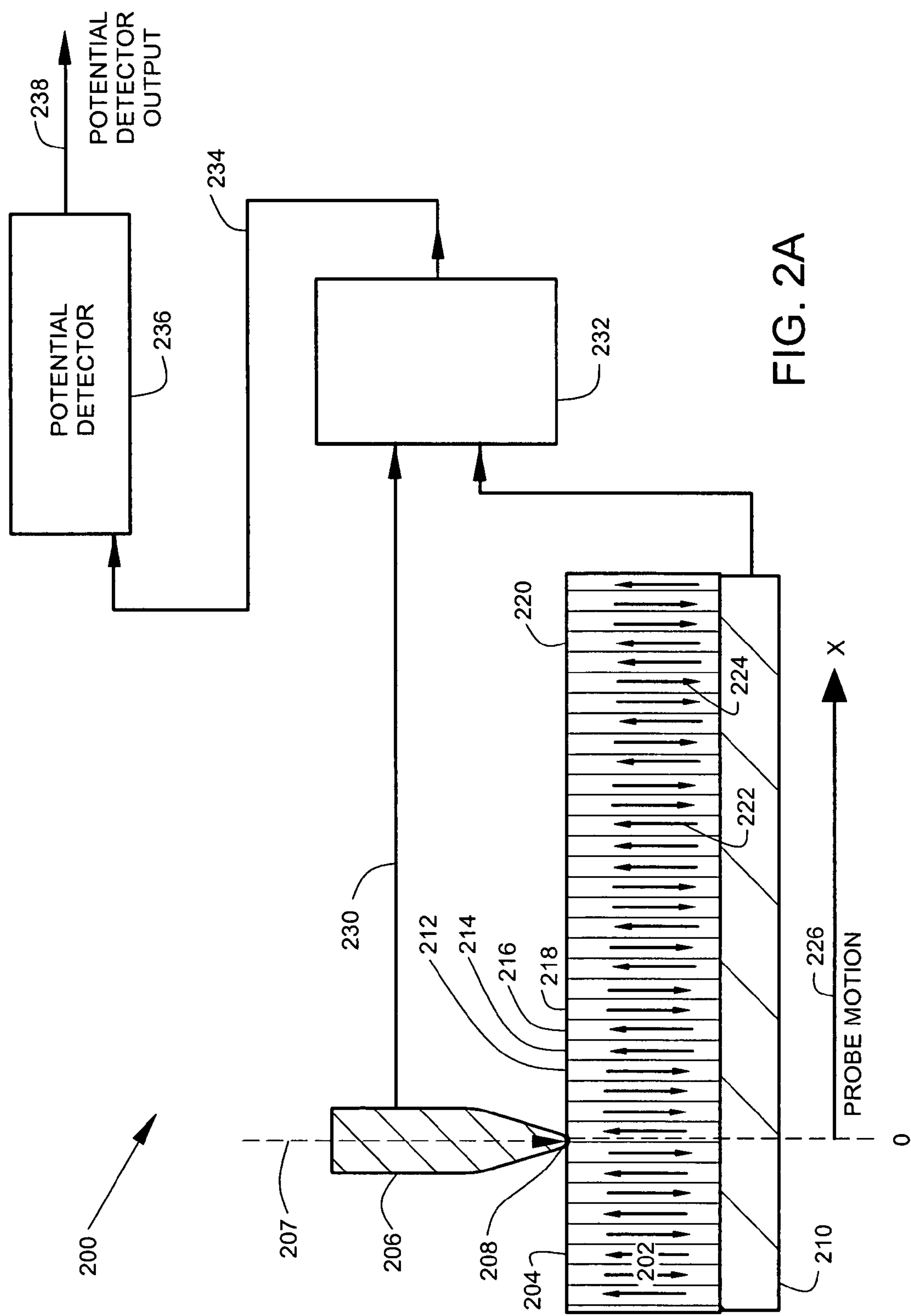
FIGS. 2A, 2B illustrate a data storage apparatus 200 sensing baseband piezoelectric potentials.
Figure 2B:
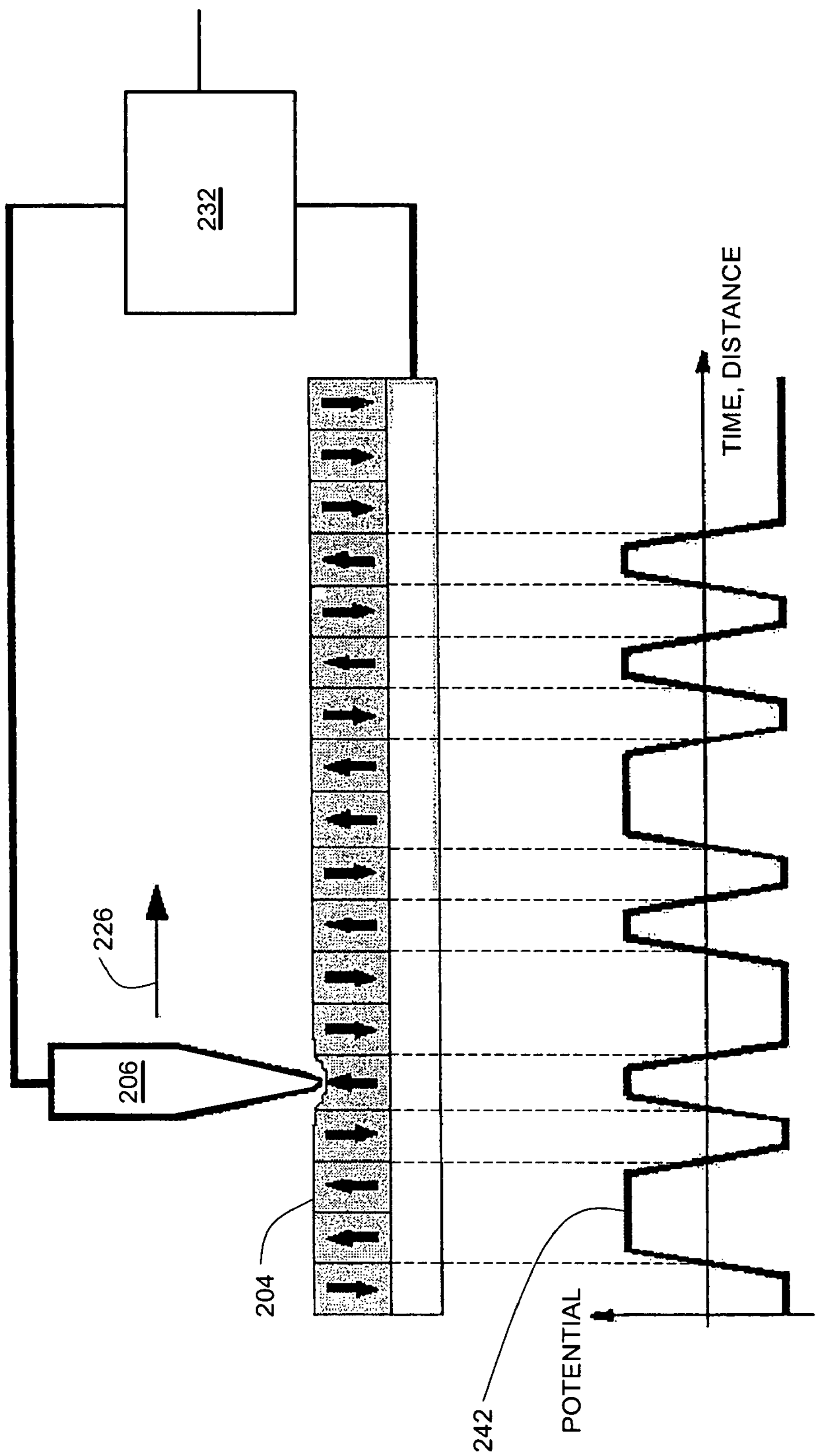

The amount of charge produced by the piezoelectric effect is quite small. Direct (baseband) detection with a relatively constant electrode force and simple amplifier and detection circuits can be used as illustrated in FIGS. 2A, 2B. Alternatively, the mechanical force on the scanning electrode can be a modulated force, and a lock-in detection technique can be used to decrease error rates as described below in connection with an example illustrated in FIGS. 3, 4, 5. If the applied pressure is modulated with a specific frequency, the generated electrical signal will also exhibit this frequency. At the interface between two different polarization states, a 180° phase jump of the electrical signal to the excitation signal will occur, which is detected by the lock-in technique.

Figure 1A:
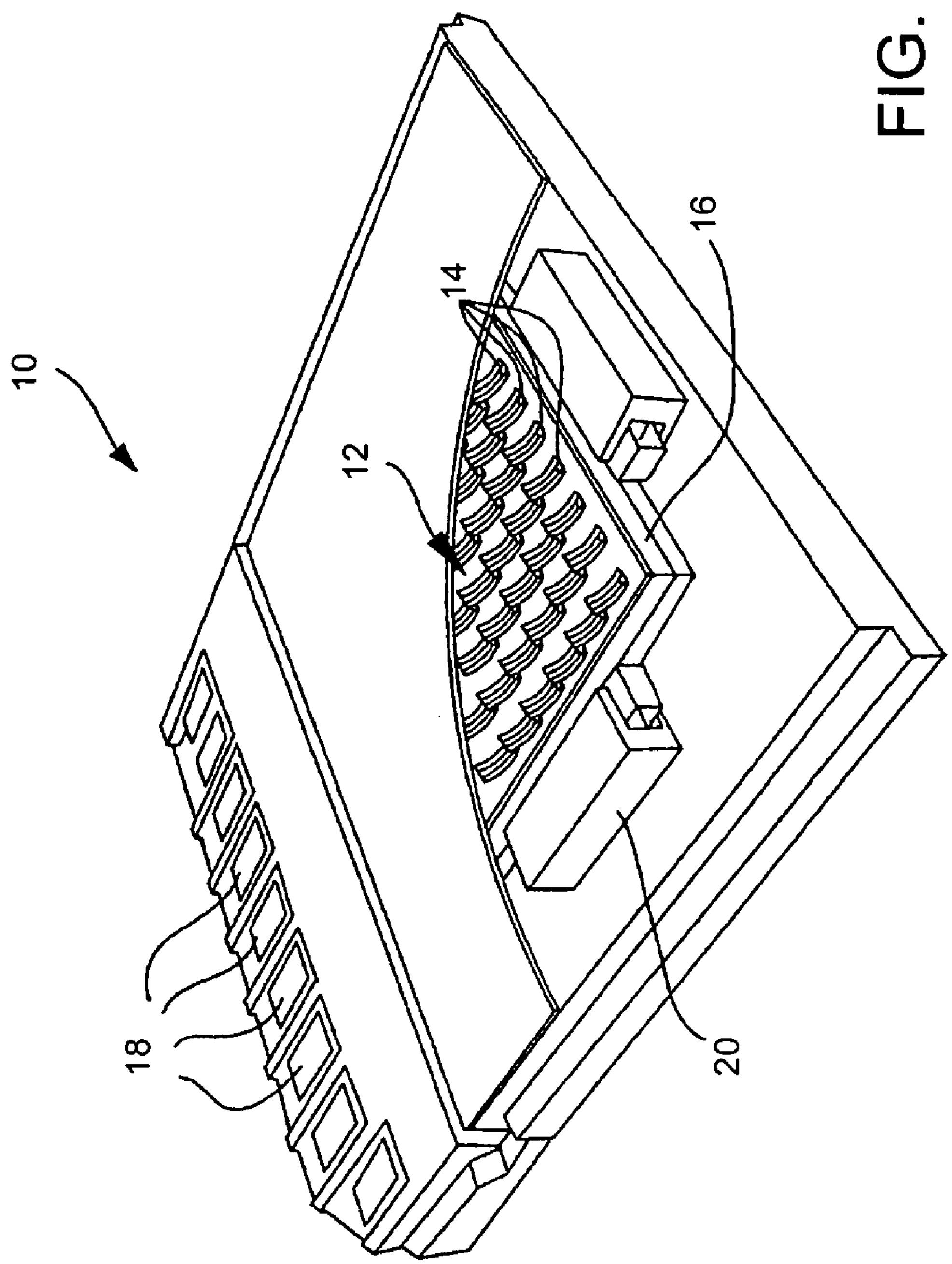
FIGS. 1A, 1B, 1C illustrate a ferroelectric data storage drive that is scanned by an electrode array.

FIG. 1A illustrates an exemplary ferroelectric data storage drive 10 in which aspects of the invention are useful. The drive 10 comprises a ferroelectric storage medium 16 with a scannable surface 12. An array of electrodes 14 contact the scannable surface 12 and communicate data to and from the scannable surface 12. Microactuators such as microactuator 20 provide relative scanning motion between the scannable surface 12 and the electrodes 14. Electrical contacts 18 provide connections between the drive 10 and a host computer system.

Figure 1B:
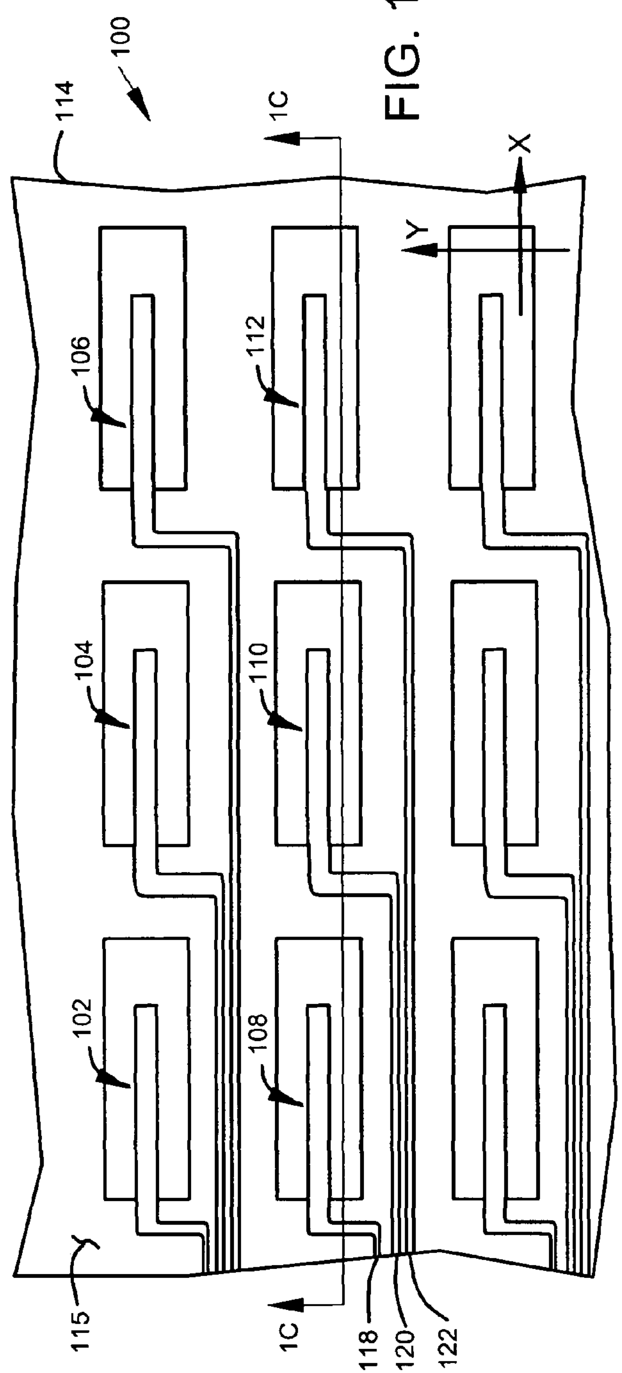
Figure 1C:
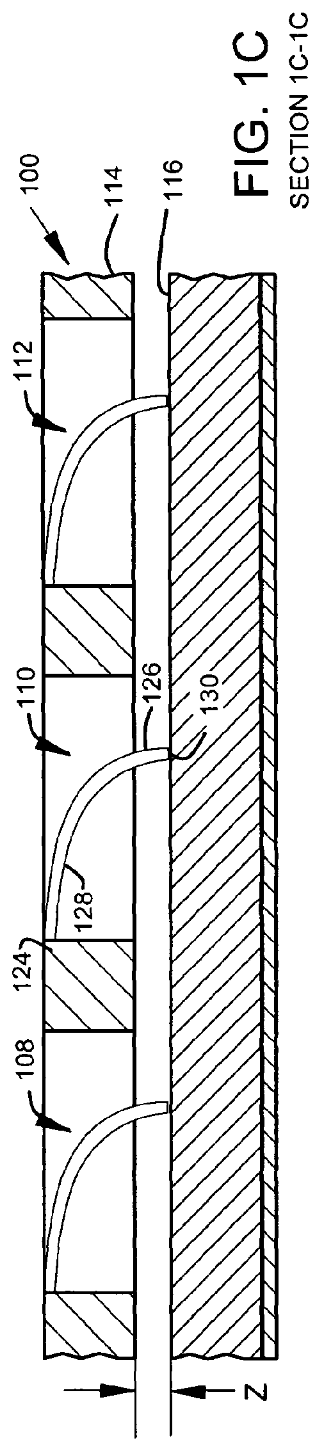

FIGS. 1B-1C illustrate an array 100 of sensing contact electrodes 102, 104, 106, 108, 110, 112 that are formed in cavities of a substrate 114. FIG. 1B illustrates a top (plan) view of the array 100, and FIG. 1C illustrates a front cross-sectional view taken along line 1C-1C in FIG. 1B.

The substrate 114 provides a common electrode support for the sensing contact electrode 102, 104, 106, 108, 110, 112. Substrate 114 is only partially shown in FIGS. 1B, 1C and can extend to support a larger number of sensing contact electrodes that are not illustrated in FIGS. 1B, 1C. The sensing contact electrodes 102, 104, 106, 108, 110, 112 are preferably arranged in a regular rectangular array, as illustrated, or in oblique alignments. The substrate 114 is movable relative to a surface 116 (FIG. 1C) along X and Y axes to provide scanning of the surface 116 by the sensing contact electrodes 102, 104, 106, 108, 110, 112. The substrate 114 is also movable by a microactuator (not illustrated in FIGS. 1B-1C) to move along a Z axis relative to the ferroelectric medium surface 116. The controlled spacing Z is typically selected to provide a desired force preload magnitude between the surface 116 and each of the sensing contact electrodes. The preload force deflects the sensing contact electrodes 102, 104, 106, 108, 110, 112 so that the sensing contact electrodes 102, 104, 106, 108, 110, 112 preferably function as springs. Relative motion between the substrate 114 and the surface 116 can be effected by motion of the substrate 114, motion of the surface 116, or motion of both the substrate 114 and the surface 116. The preload force can be continuously maintained (as discussed below in connection with FIGS. 2A, 2B) or, alternatively, the preload force can include a time varying component along a Z axis (as discussed below in connection with FIGS. 3, 4, 5).

Substrate 114 and surface 116 are illustrated as flat elements in FIGS. 1B-1C, however, the substrate 114 and the surface 116 can have other shapes such as round cylindrical shapes. The surface 116 comprises a surface of a ferroelectric memory that is accessed by the electrodes 102, 104, 106, 108, 110, 112. Relative motion between the substrate 114 and the surface 116 can be any suitable scanning motion such as random access scanning, raster scanning, or other known surface scanning motions or patterns. With the use of multiple electrodes, a large number of bits of data can be written or read simultaneously (in parallel) to provide high speed access.

Exemplary conductor leads 118, 120, 122 run over a top surface 115 of the substrate 114 to carry information to and from the sensing contact electrodes 108, 110, 112. The conductor leads 118, 120, 122 couple to electronic circuitry (not illustrated) that can be located on the substrate surface 115 or elsewhere.

An exemplary sensing contact electrode such as sensing contact electrode 110 comprises a beam support 124 (a portion of the substrate 114) and an electrode 126. The electrode 126 comprises a bent beam body 128 extending from the beam support 124 to an electrode tip face 130 spaced apart from the beam support 124. The aspects illustrated in FIGS. 1A, 1B, 1C are illustrative, and other known electrode and data storage scanning arrangements can also be used as well.

FIG. 2A illustrates a block diagram of a data storage apparatus 200. The data storage apparatus 200 comprises data storage media 202 with a scannable surface 204. A layer (or substrate) 210 underlies the data storage media 202. The layer 210 is electrically conductive and serves as a reference potential (common return) for the data storage media 202. Other known arrangements for obtaining a reference potential of ferroelectric storage media can be used as well. The data storage media 202 and the layer 210 are illustrated in cross-section in FIG. 2A. In one aspect, the scannable surface 204 comprises a generally flat surface as illustrated. In other aspects, the scannable surface 204 comprises a cylindrical surface, a tape surface or other known media surface shape. The scannable surface can include a lubricant layer or other known media interface layers.

The storage media 202 comprises a ferroelectric material. The storage media 202 comprises storage media elements 212, 214, 216, 218, . . . , 220 that are selectively polarized in an up or down direction to store data. An up arrow 222 indicates a first ferroelectric polarization (logical one) and a down arrow 224 indicates a second ferroelectric polarization (logical zero) of the stored data. The ferroelectric polarization is non-volatile, but electrically alterable so that the storage media 202 can be used as reusable data storage media.

An electrode 206 includes an electrode tip 208 that electrically contacts the scannable surface 204 with a mechanical contact force 207. The mechanical contact force 207 at the scannable surface 204 produces a mechanical stress in the data storage media 202 under the electrode tip 208. The storage media 202, in addition to comprising ferroelectric properties, also comprises piezoelectric properties. The storage media 202 generates a piezoelectric voltage responsive to the applied mechanical contact force 207. The piezoelectric voltage has a polarity that is a function of the force and is also a function of the direction of the ferroelectric data polarization. A logical one provides a first polarity of piezoelectric voltage, and a logical zero provides a second opposite polarity of piezoelectric voltage due to the mechanical contact force. The polarity of the piezoelectric voltage is controlled by the direction of polarization of the storage media 202 or, in other words, controlled by the logic state of the stored data.

The electrode 206 and the scannable surface 204 move relative to one another with a scanning motion so that the electrode mechanically scans the scannable surface 204. The scanning motion is controlled by a servo control system so that the electrode tip 208 sequentially passes over a selected sequence of storage media elements such as storage media elements 212, 214, 216, 218, . . . , 220. In one aspect, the scanning motion includes a spinning disc media and a servo controllable electrode radius on the disc media. In another aspect, the scanning motion includes X positioning of the electrode 206 and Y positioning of the scannable surface 204 under servo controls. As the electrode scans across a sequence of storage media elements 212, 214, 216, 218, . . . , 220, the electrode tip 208 senses the piezoelectric voltage of each data element relative to a reference potential of the layer 210. The term "scanning" used here refers to accessing data stored on media by relative mechanical motion between an electrode and a media surface, and does not refer to switching an array of electrical conductors in stationary contact with media.

The electrode tip 208 mechanically scans the storage media data elements 212, 214, 216, 218, . . . , 220 in an X direction 226 at a scanning speed to produce a time sequence of data bits that are piezoelectric voltages, but that represent the data stored by ferroelectric storage. The mechanical scanning speed in bits per second is referred to herein as a baseband data rate.

The electrode 206 is coupled by a lead 230 to an amplifier 232. The amplifier 232 may be positioned remote from the electrode 206 or may be positioned on the electrode 206 so that the amplifier 232 moves with the electrode 206. Positioning the amplifier 232 on the electrode 206 provides an advantage of reduced stray capacitive loading of the piezoelectric voltage. Positioning the amplifier remotely avoids the problem of connecting multiple flexible conductors to support the amplifier 232 on the moving electrode 206. The amplifier 232 amplifies the piezoelectric voltage at electrode 206. In one aspect, the amplifier 232 provides voltage gain. In another aspect, the amplifier 232 comprises a unity gain amplifier that buffers the low power, high impedance piezoelectric electrode voltage to provide a lower impedance, higher power amplifier output 234.

The amplifier 232 provides an amplifier output 234 to a piezoelectric potential detector 236. Potential detector 236 provides a potential detector output 238. The potential detector output 238 preferably comprises a digital output that represents the polarity of the scanned sequence of data bits. It will be understood by those skilled in the art that detecting the polarity of piezoelectric potential with reference to a clock signal representing the baseband scanning rate can also be described as baseband phase detection. Potential detector 236 can thus also be seen as a baseband phase detector.

In one aspect, the potential detector 236 comprises an autosynchronous potential detector. The autosynchronous phase detector uses the incoming baseband data itself to provide an internal phase reference for phase detection synchronization. In one aspect, the stored data includes preambles for improving synchronization. In a further aspect, the stored data is encoded with run length limited encoding or other encoding to improve synchronization. In one aspect, the phase detector output 238 represent polarities, and is connectable to a read channel that decodes the polarities. In another aspect, the baseband phase detector output 238 represents phase transitions, and is connectable to a read channel that decodes the phase transitions. In yet another aspect, the baseband phase detector 236 receives a phase reference from electrode position sensor (not illustrated) mounted on the electrode 206.

While the circuitry shown in FIG. 2A has been describe above in terms of analog signal processing, it will be understood by those skilled in the art that the circuitry shown in FIG. 2A can alternatively be implemented in terms of other known circuitry. The amplifier 232, for example, can be implemented with bitstream or delta sigma circuits and the amplifier output 234 can comprise a digital data stream at a bit rate that is higher than the baseband data rate. In such an alternative circuit technology, the phase detector 236 processes a digital data stream to provide polarity detection or phase detection.

The polarity detector output 238 is connectable to a read channel that includes features such as error detection and correction decoding to provide a useful readback signal to a host computer system. The contact force 207 can be provided by a spring in an electrode suspension system, or can be actively controlled by a force control system to a constant value during reading. The contact force 207 is preferably constant during readback intervals of data. The contact force 207, however, can be reduced during write intervals when a lower contact force is adequate for writing.

FIG. 2B illustrates an exemplary timing diagram for the apparatus 200 shown in FIG. 2A. As the electrode 206 moves in the direction 226 on the surface 204, a piezoelectric potential (voltage waveform) 242 is generated. The voltage waveform 242 has a polarity (baseband phase) that corresponds with the polarity of the data stored beneath the electrode 206.

Figure 3:
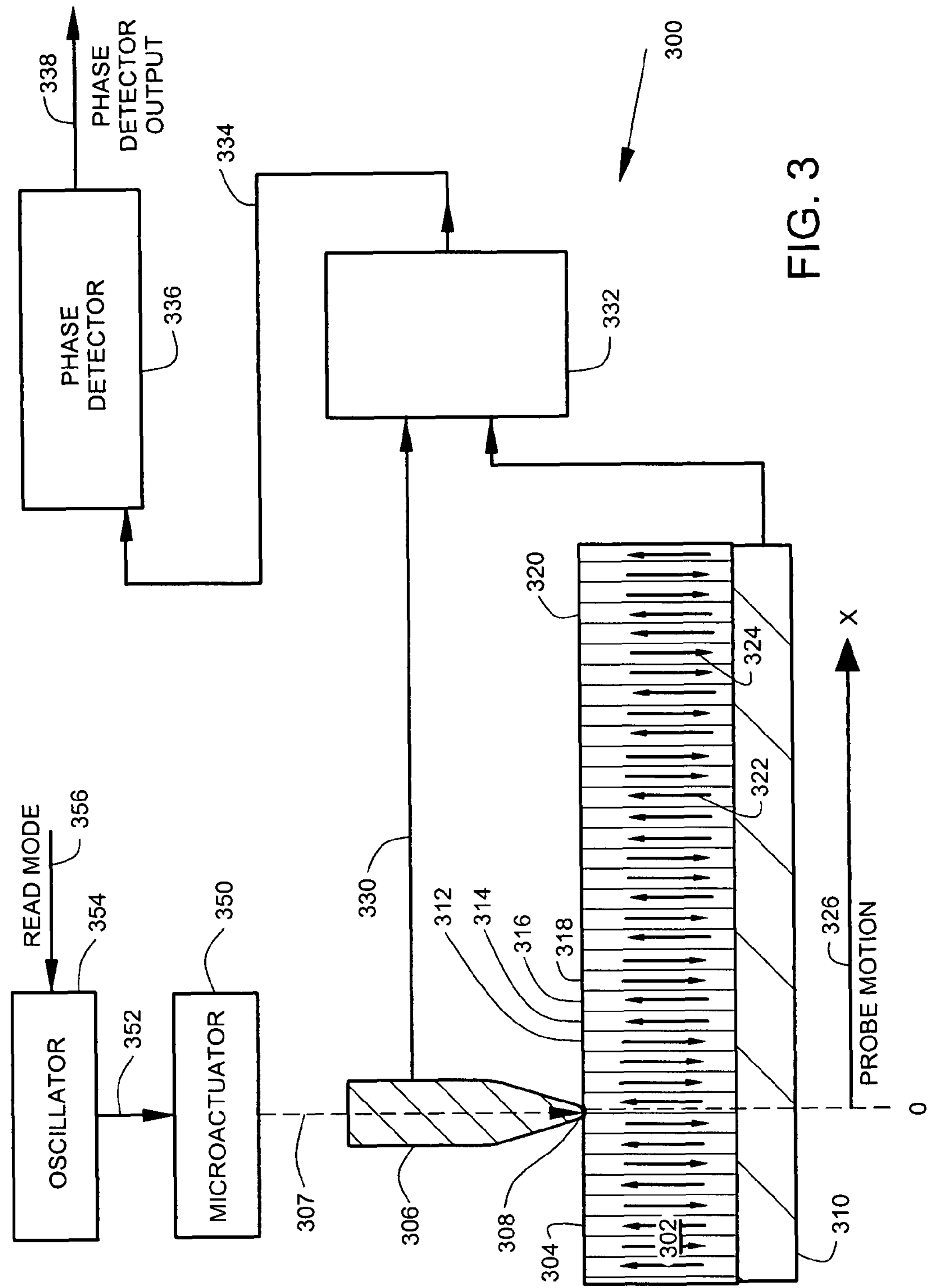
FIG. 3 illustrates a block diagram of a data storage apparatus sensing modulated piezoelectric potentials.

FIG. 3 illustrates a block diagram of a data storage apparatus 300. The data storage apparatus 300 is similar in many respects to the data storage apparatus 200 in FIG. 2A. In FIG. 3, however, a mechanical contact force 307 is not constant, but instead includes an oscillatory force component (mechanical modulation) that oscillates during a time interval while an electrode tip 308 passes over a single storage media element such as storage media elements 312, 314, 316, 318, . . . , 320. In one aspect, the mechanical contact force 307 includes a constant force component and an oscillatory or modulated mechanical force component. The modulated force component includes at least one frequency component that has a higher frequency than the baseband data rate frequency (described above in connection with FIG. 2A). In one aspect, the modulated force component has a predominant modulation that is generally sinusoidal, has a substantially fixed frequency for any particular read operation, and is referred to here as a "mechanical modulation frequency" or "carrier".

An electrode 306 scans a scannable surface 304 of data storage media 302 that is supported on a layer 310 that is a common conductor for the data storage media 302. Data is stored on the data storage media and an up arrow 322 indicates a logic one and a down arrow 324 indicates a logical zero. During scanning in X direction 326, a piezoelectric voltage is produced at an electrode tip 308. The piezoelectric voltage at electrode tip 308 includes a baseband component with a baseband polarity (baseband phase) determined by the constant mechanical force component and the logical data state, as in FIG. 2A. The piezoelectric voltage at electrode tip 308 includes a carrier component at the mechanical modulation frequency. The carrier polarity (carrier phase) of the carrier is controlled by the logical data state. The piezoelectric voltage at electrode tip 308 is coupled along line 330 to amplifier 332.

In one aspect, amplifier 332 comprises a narrowband filter with a passband centered around the carrier frequency. The modulation process is mechanical, and the carrier frequency is somewhat variable. In one aspect, the amplifier 332 includes a tracking filter to track variations in the carrier frequency, the bit rate or both. The amplifier 332 provides an amplifier output 334 to a phase detector 336. The phase detector 336 detects the phase of the amplified carrier component which is indicative of the logical state of data that is scanned. The phase detector is "locked in" to a modulation phase reference. Operation of the amplifier 332 and the phase detector 336 at the carrier frequency rather than the baseband frequency provide a noise resistant channel and a greatly increased number of samples per data bit to reduce bit error rate. The phase detector 336 provides a phase detector output 338. The phase detector output 338 is couplable to a read channel decoder that provides error detection and correction before passing data on to a host computer system. In one aspect, the phase detector also provides a reliability or probability output that indicates the probability of accuracy of each output bit from the phase detector. The probability output can be coupled to the read channel and used in the error correction process.

In one aspect the oscillatory component of the mechanical contact force 307 is generated by a microactuator 350. An oscillator 354 provides an electrical drive 352 to the microactuator 350. The oscillator 354 is controllable by a read mode command 356. The oscillator can be selectively activated during the read mode, and shut off during a write mode. In one aspect, the oscillator 354 is a VFO that is synchronized to run at a multiple of the baseband bit rate. The microactuator 350 can comprise any suitable microactuator that provides the desired level of oscillatory force and can comprise an electrostatic actuator, a piezoelectric actuator, a magnetostrictive actuator, or other known type of microactuator.

Figure 4:
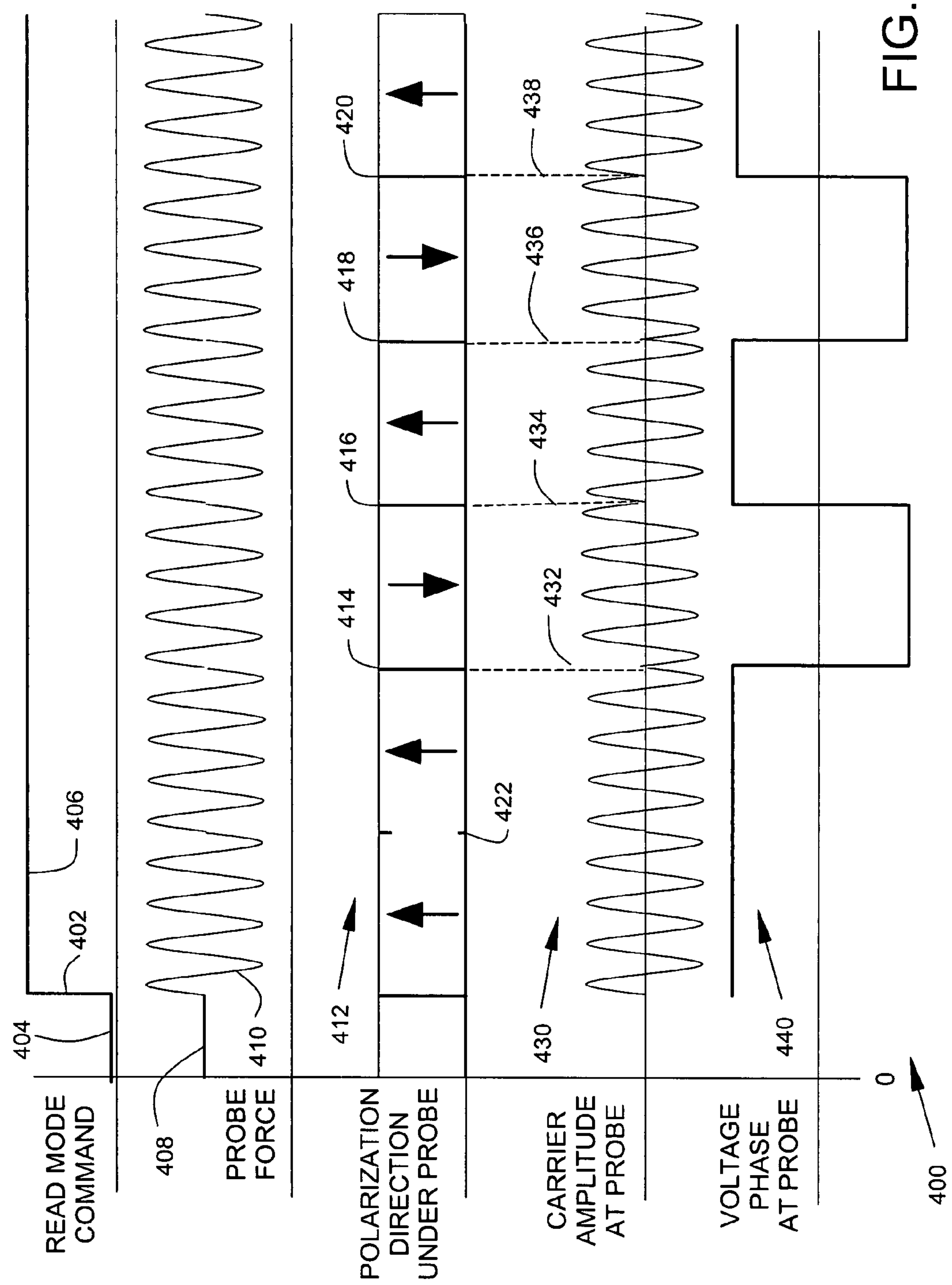
FIG. 4 illustrates a timing diagram corresponding generally with FIG. 3.

FIG. 4 illustrates an exemplary timing diagram 400 corresponding generally with the apparatus 300 shown in FIG. 3. In FIG. 4, horizontal axes represent time and vertical axes represent amplitudes. The timing diagram includes graphical representations of the electrical read mode command (356 in FIG. 3), the mechanical electrode force (307 in FIG. 3), the direction of polarization of the storage media 302 under the electrode tip 308, the carrier component of voltage amplitude sensed at the electrode tip 308 and present on line 330, and the phase of the carrier component on line 330. It is understood by those skilled in the art that timing diagrams show timing relationships between multiple signals in a system, and that actual measurements of a system will include noise and other artifacts that may not be explicitly illustrated in a timing diagram.

At time 402, the read mode command 356 changes from a first logic state 404 to a second logic state 406, indicating that the apparatus 300 is starting a READ mode of operation. The oscillator 354, responsive to the second logic state 406, begins providing the oscillatory electrical drive 352 to the microactuator 350.

Up until the time 402, the mechanical contact force 307 includes only a constant mechanical force component 408, which is represented by a straight line. After time 402, the mechanical contact force 307 includes both a constant mechanical force component and a modulated force component which is represented by oscillator line 410 which is offset from zero by the level of the constant mechanical force component 408. In one aspect, the constant mechanical force component is larger than the modulated force component, and the total contact force does not drop to zero at any time during the oscillation.

The storage media 302 under the electrode tip 308 is polarized in one of two directions under the electrode tip 308 as illustrated at 412 in FIG. 4. The storage media has polarization direction transitions at times 414, 416, 418, 420. There is no polarization direction transition, however, at time 422.

The storage media 302 under the electrode tip 308 is piezoelectric, and generates a piezoelectric voltage that is sensed by electrode tip 308. The piezoelectric voltage is a function of the amplitude of the mechanical contact force 307 and also has a phase that is a function of the direction of the polarization under the electrode tip 308.

The voltage at electrode tip 308 includes a carrier component 430. The carrier component 430 has a phase 440 (relative to the electrode force) and the phase 440 has phase transitions at times 432, 434, 436, 438. The phase transitions 432, 434, 436, 438 correspond with polarization phase transitions 414, 416, 418, 420.

Figure 5:
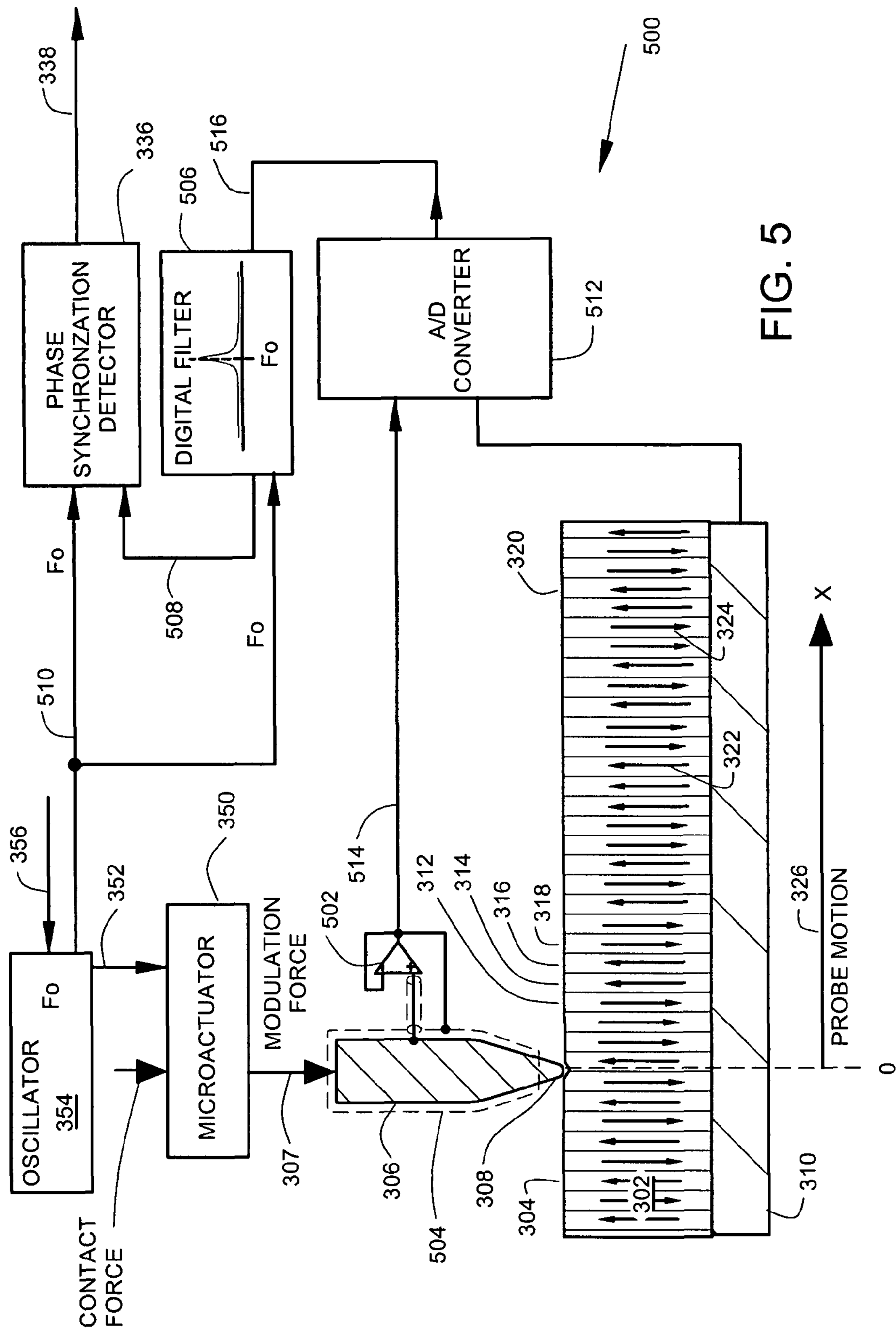
FIG. 5 illustrates a block diagram of a data storage apparatus that includes shielding, digital filtering and phase synchronous detection.

FIG. 5 illustrates a block diagram of a data storage apparatus 500. Data storage apparatus 500 is similar to data storage apparatus 300 in many respects. Reference numbers used in FIG. 5 that are the same as reference number used in FIG. 3 identify the same or similar features.

In FIG. 5, a unity gain buffer amplifier 502 is provided. The input of amplifier 502 is coupled to the electrode 306. The output of amplifier 502 is coupled along line 514 to A/D converter 512. The output of amplifier 502 is connected to a shield 504 that substantially surrounds the electrode 306 as illustrated. The amplifier 502 has a gain of 1 (or slightly less than 1). The shield 504 is driven by the amplifier 514 to have substantially the same potential as the electrode 306. This arrangement is referred to as a driven shield (also called driven screen) and effectively reduced stray capacitance between the electrode 306 and the surrounding environment. The amplifier 514 has a low impedance output such that coupling of noise to line 514 from the environment is loaded by low impedance output, and voltage noise at the input of A/D converter 512 is reduced. A/D converter 512 can be a bitstream converter, a delta sigma converter or other known type of A/D converter. An A/D converter output 516 is coupled to a digital filter 506. Digital filter 506 has a narrow passband centered around the carrier frequency Fo. An Fo reference output 510 is coupled to the digital filter 506. The digital filter 506 provides a digital filter output 508 that couples to a phase synchronization detector 336. The phase synchronization detector 336 receives the Fo modulation phase reference output 510 which serves as a modulation phase reference.

In other respects, the apparatus 500 is similar to the apparatus 300. Features disclosed with respect to one of the apparatus 200, 300, 500 can be used or appropriately adapted for use with another one of the apparatus 200, 300 and 500.

Figure 6:
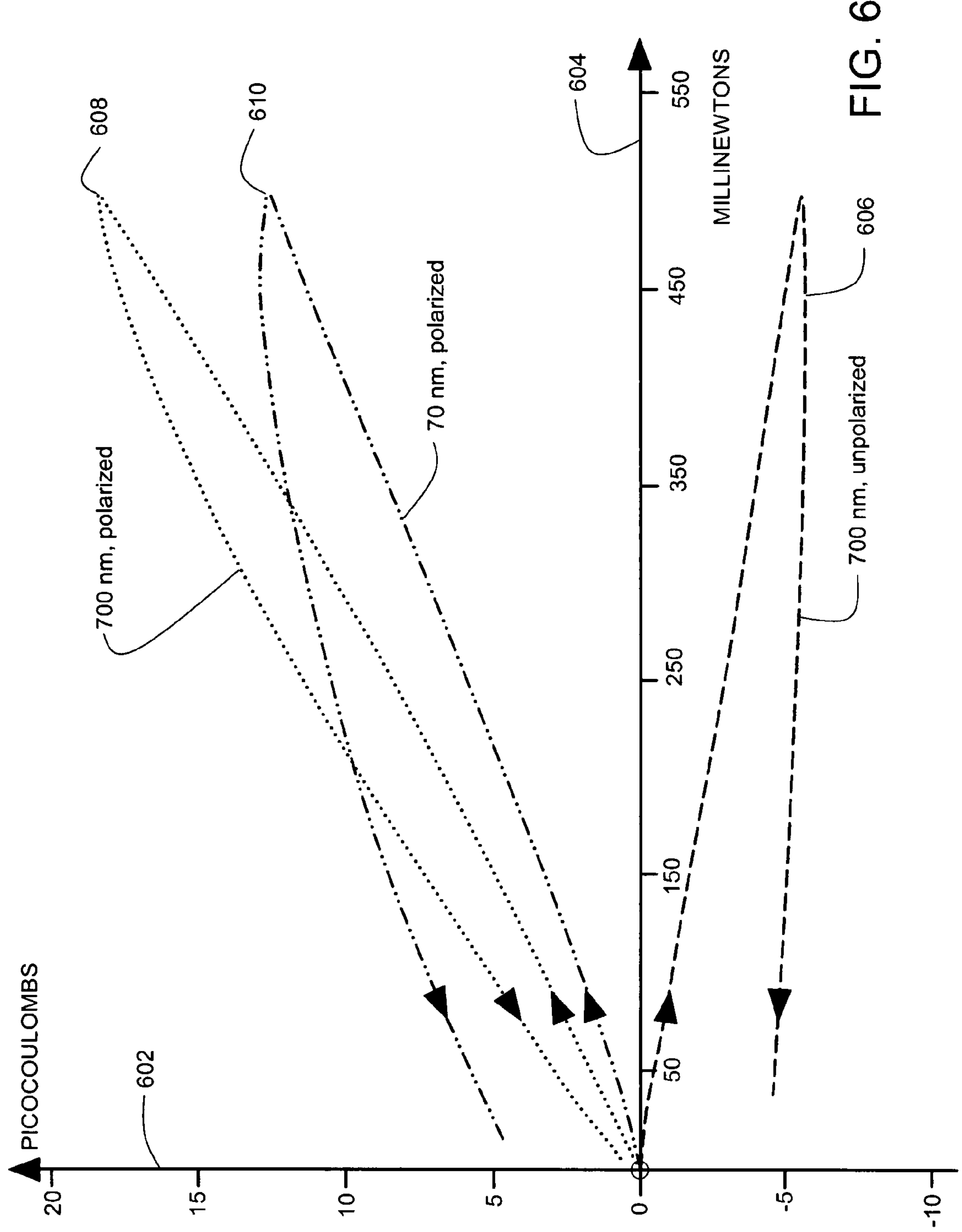
FIG. 6 illustrates a graph of charges that are produced piezoelectrically.

FIG. 6 illustrates a graph of charges that are piezoelectrically produced by forces from static (non-scanned) nanoindentation electrodes on ferroelectric thin film layers. The data shown in FIG. 6 is known from V. Koval et al., J. Appl. Phys., 97, 074301, 2005. A vertical axis 602 represents charge in picocoulombs. A horizontal axis 604 represents applied force in millinewtons.

A dashed line 606 represents charge produced by increasing force to from near zero up to 500 millinewtons and then decreasing the force back to near zero force. For dashed line 606, a 700 nanometer thin film ferroelectric layer is considered to be in a random initial condition of slight negative polarization. A charge of about −5 picocoulombs is produced as illustrated.

After completion of the force application cycle represented by dashed line 606, the 700 nanometer thin film is next positively polarized. After completion of the positive polarization process, a force on a nanoindentation electrode is increased from near zero up to 500 millinewtons and then is decreased to near zero force. As illustrated by dotted line 608, the charge produced is approximately +18 picocoulombs.

As illustrated by line 610, a charge of approximately +12 picocoulombs is produced by a positively charged layer with a thickness of 70 nanometers.

The charge Q that is piezoelectrically generated in response to a force, F, due to the piezoelectric response of a material with a piezoelectric coefficient d, is approximately:

$$Q=dF. \qquad \text{Equation 1}$$

The capacitance C of a parallel plate capacitor with area A, filled with a dielectric of the thickness D and dielectric constant $\in$, is given by:

$$C=_{\in}\in_o A/D. \qquad \text{Equation 2}$$

If a charge is placed on a capacitor, a voltage U=Q/C will result. Therefore, the voltage signal is given by:

$$U=Q/C=(dF)/(_{\in}\in_o A/D)=(dfD)/(_{\in}\in_o A). \qquad \text{Equation 3}$$

The force used to press the tip of an AFM onto the sample in contact mode could be up to 100 nanonewtons (nN). A typical contact area of an AFM tip is 400 square nanometers ($nm^2$). For $BaTiO_3$, d is approximately 86 picocoulombs per newton (pC/N) and $\in$=170.

The released charge, for D=40 nm, is estimated to be $8.6\times10^{-18}$ C (about 54 electrons) and would result in a voltage signal of +/−0.6 V. This voltage signal is obtained when capacitive loading from a voltage measurement circuit is negligible. The sign of the voltage signal depends on whether the direction of the polarization is opposed to or in the same direction as the pressure and therefore allows the detection of the polarization state.

It is to be understood that even though numerous characteristics and advantages of various aspects of the invention have been set forth in the foregoing description, together with details of the structure and function of various aspects of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the piezoelectric reading system while maintaining substantially the same functionality without departing from the scope and spirit of the present invention.

What is claimed is:

1. An apparatus, comprising:

data storage media with a scannable surface;

an electrode contacting the scannable surface with a contact force; and the data storage media generating a baseband piezoelectric potential that is picked up by the electrode.

2. The apparatus of claim 1, wherein the baseband potential has a polarity that varies as a function of data polarity on the data storage media.

3. The apparatus of claim 2, comprising:

a read circuit coupled to the electrode that receives the baseband potential and provides a read circuit output that is representative of the phase.

4. The apparatus of claim 3 wherein the electrode comprises an electrostatic shield and the read circuit comprises a unity gain amplifier with an amplifier input coupled to the electrode and an amplifier output driving the electrostatic shield to reduce stray capacitance of the electrode.

5. The apparatus of claim 3 wherein the read circuit comprises an analog-to-digital converter coupled to the electrode.

6. The apparatus of claim 1, comprising:

an actuator modulating the contact force with a modulation force, the data storage media generating a modulated potential that is picked up by the electrode.

7. The apparatus of claim 6 wherein the actuator is controllable by a read command.

8. The apparatus of claim 1 comprising an array of spaced apart electrodes that contact multiple locations on the scannable surface.

9. The apparatus of claim 6 wherein the actuator comprises a piezoelectric microactuator.

10. The apparatus of claim 9 and further comprising an oscillator providing an oscillatory electrical output to the actuator.

11. A method, comprising:

providing a scannable ferroelectric data storage surface and a scanning electrode contacting the storage surface with a contact force;

sensing a piezoelectric voltage that is generated at the storage surface by the contact force; and detecting data stored on the storage media as a function of the polarity of the sensed piezoelectric voltage.

12. The method of claim 11 wherein the sensed piezoelectric voltage comprises a baseband piezoelectric voltage.

13. The method of claim 11 and modulating the contact force to generate a modulated piezoelectric voltage.

14. The method of claim 11 and shielding the contact electrode with a shield that is driven at substantially the sensed piezoelectric voltage.

15. The method of claim 11 and amplifying the sensed piezoelectric voltage with an amplifier.

16. The method of claim 11 and controlling the contact force with a read command.

17. A circuit, comprising:

a ferroelectric electrode scanning system having data stored thereon with a data polarity, the scanning system generating a piezoelectric potential as a function of the data polarity;

an amplifier receiving the piezoelectric potential and providing an amplified output; and a detector receiving the amplified output and generating a detector output indicating the data polarity.

18. The circuit of claim 17 comprising a microactuator modulating a scanning force and the detector demodulating the amplified output.

19. The circuit of claim 17 comprising: a electrostatic shield that shields the piezoelectric potential.

20. The circuit of claim 17 wherein the detector comprises a modulation phase detector.

* * * * *